United States Patent
Lee et al.

(10) Patent No.: US 8,890,310 B2
(45) Date of Patent: Nov. 18, 2014

(54) POWER MODULE PACKAGE HAVING EXCELLENT HEAT SINK EMISSION CAPABILITY AND METHOD FOR MANUFACTURING THE SAME

(75) Inventors: Keunhyuk Lee, Bucheon-si (KR); Oseob Jeon, Bucheon-si (KR); Seungwon Lim, Bucheon-si (KR)

(73) Assignee: Fairchild Korea Semiconductor, Ltd., Bucheon-si (KR)

( * ) Notice: Subject to any disclaimer, the term of this patent is extended or adjusted under 35 U.S.C. 154(b) by 388 days.

(21) Appl. No.: 12/730,294

(22) Filed: Mar. 24, 2010

(65) Prior Publication Data
US 2010/0176498 A1 Jul. 15, 2010

Related U.S. Application Data

(63) Continuation of application No. 12/565,274, filed on Sep. 23, 2009, now abandoned, which is a continuation
(Continued)

(30) Foreign Application Priority Data

| Jun. 11, 2001 | (KR) | 200132489 |
| Apr. 17, 2002 | (KR) | 200220779 |
| Aug. 21, 2004 | (KR) | 200466176 |

(51) Int. Cl.
*H01L 23/495* (2006.01)
*H01L 23/10* (2006.01)
(Continued)

(52) U.S. Cl.
CPC ............ *H01L 23/49575* (2013.01); *H01L 24/48* (2013.01); *H01L 2224/45144* (2013.01); *H01L*
(Continued)

(58) Field of Classification Search
USPC .................... 257/675, 706, E23.106, E23.14, 257/E23.101, E23.136, E23.052, 666, 713, 257/E23.031
See application file for complete search history.

(56) References Cited

U.S. PATENT DOCUMENTS

4,939,316 A * 7/1990 Mahulikar et al. ............ 174/546
5,449,951 A * 9/1995 Parthasarathi et al. ........ 257/677
(Continued)

*Primary Examiner* — Nitin Parekh
(74) *Attorney, Agent, or Firm* — Christensen O'Connor Johnson Kindness PLLC (57) ABSTRACT

A power module package includes a power circuit element, a control circuit element, a lead frame, an aluminum oxide substrate having a heat sink and an insulation layer, and a sealing resin. The control circuit element is electrically connected with the power circuit element to control chips within the power circuit element. The lead frame has external connection terminal leads in its edge and has a first surface to which the power circuit element and the control circuit element are attached and a second surface which is used as a heat transmission path. The heat sink is a plate made of metal such as aluminum and the electrical insulation layer is formed at least on an upper surface of the heat sink and made of aluminum oxide. The electrical insulation layer may be formed over an entire surface of the heat sink. Here, the insulation layer is attached to the second surface by an adhesive, on a region below where the power circuit element is attached, to the first surface of the lead frame. In addition, the sealing resin encloses the power circuit element and the control circuit element, the lead frame, and the metal oxide substrate and exposes the external connection terminals of the lead frame.

9 Claims, 7 Drawing Sheets

Related U.S. Application Data of application No. 11/208,385, filed on Aug. 19, 2005, now abandoned, and a continuation-in-part of application No. 10/167,067, filed on Jun. 10, 2002, now Pat. No. 7,061,080.

(51) Int. Cl.
*H01L 23/433* (2006.01)
*H01L 25/16* (2006.01)
*H01L 23/00* (2006.01)

(52) U.S. Cl.
CPC ............ *2224/48137* (2013.01); *H01L 23/4334* (2013.01); *H01L 2224/48091* (2013.01); *H01L 25/165* (2013.01); *H01L 2924/01019* (2013.01); *H01L 25/162* (2013.01); *H01L 2924/13055* (2013.01); *H01L 2224/45124* (2013.01); *H01L 2924/01004* (2013.01); *H01L 2924/01078* (2013.01); *H01L 2924/01079* (2013.01); *H01L 2224/48247* (2013.01)
USPC .... 257/706; 257/666; 257/713; 257/E23.031; 257/E23.101

(56) References Cited

U.S. PATENT DOCUMENTS

| | | | |
|---|---|---|---|
| 5,796,159 A * | 8/1998 | Kierse | 257/668 |
| 6,291,880 B1 * | 9/2001 | Ogawa et al. | 257/723 |
| 6,313,520 B1 * | 11/2001 | Yoshida et al. | 257/676 |
| 6,313,598 B1 * | 11/2001 | Tamba et al. | 318/722 |
| 6,852,567 B1 * | 2/2005 | Lee et al. | 438/106 |
| 6,979,909 B2 * | 12/2005 | Shinohara | 257/796 |
| 7,449,774 B1 * | 11/2008 | Jeun et al. | 257/712 |
| 2003/0011054 A1 | 1/2003 | Jeun et al. | |
| 2003/0025195 A1 * | 2/2003 | Nakamura et al. | 257/706 |

\* cited by examiner

POWER MODULE PACKAGE HAVING EXCELLENT HEAT SINK EMISSION CAPABILITY AND METHOD FOR MANUFACTURING THE SAME

CROSS-REFERENCE TO RELATED APPLICATIONS

This application is a continuation of U.S. patent application Ser. No. 12/565,274 filed Sep. 23, 2009, which is a continuation of U.S. patent application Ser. No. 11/208,385 filed Aug. 19, 2005, which claims priority to Korean Patent Application No. 2004-66176, filed on Aug. 21, 2004, in the Korean Intellectual Property Office and is also a continuation-in-part of U.S. patent application Ser. No. 10/167,067, filed Oct. 26, 2004, now U.S. Pat. No. 7,061,080, which claims priority to Korean Patent Application No. 2002-20779, filed on Apr. 17, 2002 in the Korean Intellectual Property Office and Korean Patent Application No. 2001-32489, filed on Jun. 11, 2001, in the Korean Intellectual Property Office. All of the above-listed applications are hereby incorporated by reference in their entirety.

BACKGROUND OF THE INVENTION

1. Field of the Invention

The present invention relates to a semiconductor package, and more particularly, to a power module package having excellent heat transfer characteristics.

2. Description of the Related Art

Generally, a semiconductor package is manufactured in the following way: one or more semiconductor chips, such as power semiconductor devices or integrated circuits, are mounted on a lead frame or a printed circuit board (PCB), then sealed with an epoxy molding compound (EMC) for protecting the chips, and the packaged chips are mounted on a mother board or a PCB for a system. As used hereinafter the word "chip" means a semiconductor power device or a semiconductor integrated circuit. A semiconductor power device may be a single power transistor or one or more power transistors including one or more transistors for controlling or monitoring operation of the power transistors.

While integrated circuits and other electronic apparatus have long experienced demands for high speed, high capacity, and high levels of integration, now power devices such as those applied to automobiles, industrial apparatus, and home appliances are also confronting similar demands for reduced size, lower weight and low cost. One way of resolving these demands is to construct a power module package that contains two or more semiconductor chips in a single semiconductor package. Such power module packages include one or more power circuit chips and a control circuit chip. But power circuit chips generate much more heat than the heat generated by integrated circuits or control chips. Therefore, effectively transferring heat from the chips to outside the package is critical for maintaining high reliability for a long time for such power modules.

Figure 1:
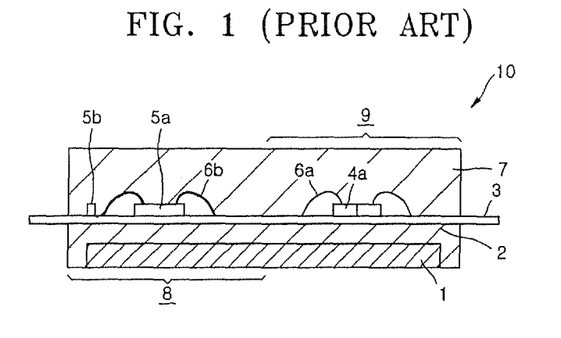
FIG. 1 is a schematic, cross-sectional view of one example of a power module package according to a related art.

The U.S. Pat. No. 5,703,399 by Majumdar, entitled "Semiconductor power module" discloses a power module package having a heat sink and FIG. 1 herein illustrates a cross-sectional view of the power module package shown in that patent. Referring to FIG. 1, the power module package 10 mounts a plurality of semiconductor chips constituting a power device 9 and a control device 8 on a lead frame 3 that has a heat sink 1 below the lead frame 3. The package shown In FIG. 1 has two types of EMC. Reference numeral "2" represents a "lower EMC" having excellent thermal conductivity and ordinary electrical insulation and upper EMC 7 has ordinary thermal conductivity and excellent electrical insulation. The power circuit chip 4a is mounted on one side of the lead frame 3 and a control integrated circuit chip 5a is mounted on the same side of the lead frame 3 and spaced from the power chip 4a. Reference numerals 5b, 6b and 6a represent, respectively, a resistance component, a gold wire, and an aluminum wire. In the power module package 10 having the construction as described above, heat generated from the power circuit chip 5a is mostly delivered to the heat sink 1 through lower EMC 2 and then to outside the power module package 10 through the heat sink 1. According to the above United States patent, the heat sink 1 is made of a metal having high thermal conductivity such as copper or aluminum.

When, as in the package 10 where the heat sink 1 is manufactured using electrically conductive material such as metal, the lower EMC 2 should satisfy the following two conditions. First, heat transferred from the power circuit chip 4a should be transferred quickly to the heat sink 1. Second, the lead frame 3 should be electrically insulated from the heat sink 1.

To satisfy these conditions, the above United States patent uses an EMC with high thermal conductivity for the lower EMC 2. However, even though the EMC has high thermal conductivity, its thermal conductivity is 2 W/m·K, which is much less than the thermal conductivity of an aluminum heat sink 1 whose thermal conductivity is 100 W/m·K. In order to provide sufficient electrical insulation between the heat sink 1 and the lead frame 3, the lower EMC 2 should be at least 500 µm thick or more so that the lead frame may be insulated from the heat sink 1. If the EMC 2 is much thinner, then one or both devices 4a, 5a may short circuit to the heat sink 1 and damage or destroy the power module 10. As such, the heat sinking ability of the power module package 10 is limited by the lower EMC 2.

The power module package 10 uses two EMCs 2 and 7 and each has different properties. Those skilled in the art understand that there is often a tradeoff between the electrical insulating ability of a molding compound and its thermal conductivity. In general, as one increases, the other decreases. So, in the package 10 that requires an EMC having high electrical insulation for the upper EMC, a two-stage molding process is performed. Accordingly, a manufacturing process of the power module package 10 is complex and costly. One way of solving the above problem and using only one EMC is shown in Korean Patent Publication No. 2002-0095053, filed by the same applicant as the present invention, and entitled "Power module package having improved heat emission capability and method thereof." FIG. 2 herein illustrates a schematic, cross-sectional view of an example of the power module package 100 suggested by the above Korean Patent Publication.

Figure 2:
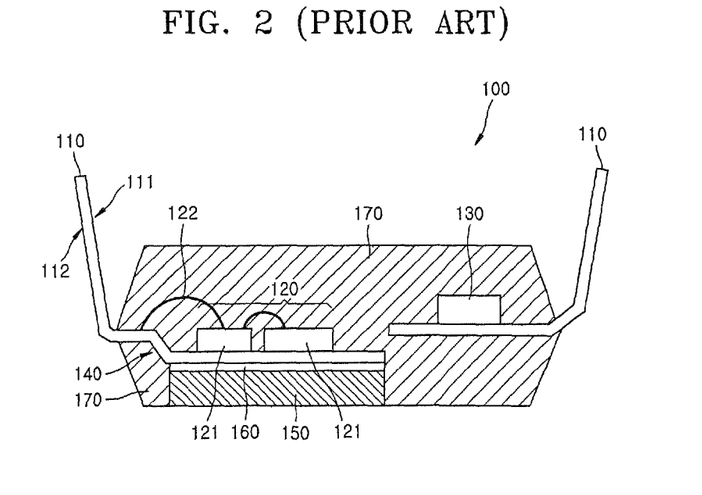
FIG. 2 is a schematic, cross-sectional view of another example of a power module package according to a related art.

Referring to FIG. 2, the power module package 100 mounts a power circuit element 120 and a control circuit element 130, both on a first surface 111 of the lead frame 110. The power circuit element 120 is mounted on a down-set (recessed) die pad 140 of the lead frame 110. A heat sink 150 is attached to a second surface 112 of the down-set die pad 140 by a high temperature tape 160. In FIG. 2, reference numerals 121, 122, 130, 132, and 170 represent one or more power circuit chips, an aluminum wire, a control circuit chip, a gold wire, and an EMC, respectively.

In the power module package 100, a heat sink 150 made of ceramic is directly attached to a backside of a down-set die pad 140 by a high temperature tape 160. The high temperature tape 160 can be as thin as about 50 µm. Since the sealing process for the power module package 100 is performed using only one EMC 170, the manufacturing process for the package shown in FIG. 2 is simpler than the process for the package of FIG. 1 and the process to make the package of FIG. 2 can be automated to further reduce cost.

However, the ceramic heat sink 150 has a thermal conductivity of about 24 W/m·K, so that its heat sinking ability is not as good as metal, and further, ceramic is more expensive than metal. Still further, there is limit on how thin one can make a ceramic heat sink because ceramic is brittle and will crack if it is too thin.

Figure 3:
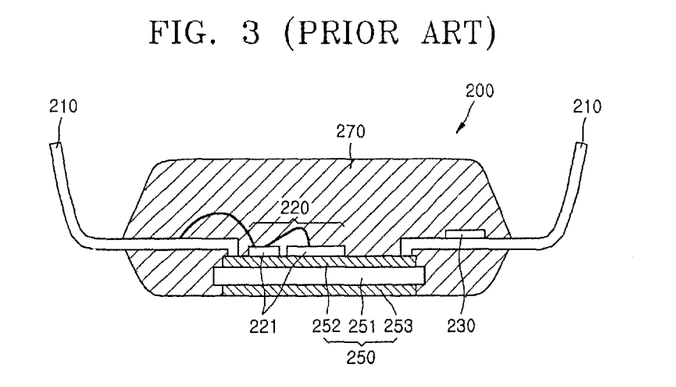
FIG. 3 is a schematic, cross-sectional view of still another example of a power module package according to a related art.

FIG. 3 illustrates a cross-sectional view of another example of a power module package 200 disclosed in the above-described Korean Patent Publication No. 2002-0095053. Referring to FIG. 3, the power module package 200 uses a direct bonded copper (DBC) substrate 250. The DBC substrate 250 includes: a ceramic plate 251 at the center; an upper copper layer 252 attached to an upper surface of the ceramic plate 251; and a lower copper layer 253 attached to a lower surface of the ceramic plate 251. One or more power circuit chips 221 are mounted on the upper copper layer 252 and the lower copper layer 253 acts as a heat sink of the power module package 200. Reference numerals 210, 222, and 270 represent a lead frame, an aluminum wire, and EMC, respectively.

According to the power module package 200, the upper and the lower copper layers 252 and 253 are directly attached to the ceramic plate 251 without using EMC (refer to the reference numeral 2 in FIG. 1) or a high temperature adhesive (refer to the reference numeral 160 in FIG. 2) and the heat dissipation capability of the heat sink 250 is excellent thanks to high thermal conductivity of copper. Further, since the copper layers 252 and 253 are attached to the upper and lower surfaces of the ceramic plate, problems caused by brittleness of the ceramic are overcome. Still further, since the encapsulation process for the power module package 200 is performed in a single transfer molding process using one EMC 270, its manufacturing process can be simplified and automated to reduce costs.

However, the ceramic plate 251 of DBC substrate 250 still has a lower thermal conductivity than metal and the ceramic plate 251 is still about 635 μm thick so that the manufacturing cost of the DBC process is high. As such, there is still substantial room for reducing the size and improving thermal dissipation ability of the power module package 200.

SUMMARY OF THE INVENTION

The present invention provides a power module package and a manufacturing method thereof, with excellent heat dissipation ability and a simpler and lower cost method of automated manufacture.

According to one aspect of the present invention, there is provided a power module package and a manufacturing method thereof, capable of reducing manufacturing costs and reducing the thickness of a substrate or a heat sink so that it has appropriate characteristics for a power module package. The invention includes a heat sink that has a core or central element made of metal and a one or more electrical insulating layers comprising a compound of the metal and one or more other elements, in particular, an oxide of the metal on the core or central element.

According to another aspect of the present invention, there is provided a power module package, which includes: a power circuit element; a control circuit element; a lead frame; a metal oxide substrate; and an EMC. The control circuit element is connected with the power circuit element to control operation of the power circuit element. The lead frame has external connection terminal leads in its edge and has a first surface to which the power circuit element and the control circuit element are attached and a second surface used to transfer heat away from the chips. A metal/metal oxide substrate, e.g., an aluminum/aluminum oxide substrate acts as a heat sink and an insulation layer. The heat sink is a plate made of aluminum and the electrical insulating layer is formed at least on an upper surface of the heat sink and made of the aluminum oxide. The aluminum oxide layer is an electrical insulating layer that is affixed to the lead frame by an adhesive or other suitable means. The aluminum oxide layer covers all or at least part of the second surface of the lead frame below a region where the power circuit element is attached. The EMC encloses the power circuit element, the control circuit element, the lead frame, and the metal/metal oxide substrate and exposes the external connection terminal of the lead frame.

According to further another aspect of the present invention, there is provided a power module package, which includes: a metal/metal oxide substrate; an upper wiring layer; external connection terminal leads; a power circuit element; a control circuit element; and an EMC. The metal/metal oxide substrate includes: a heat sink of a plate made of metal, e.g., aluminum and an electrical insulation layer formed at least on an upper surface of the heat sink and made of an oxide of the metal, in particular, aluminum oxide. An upper wiring layer has a wiring pattern and is directly attached to an upper surface of the insulation layer. The external connection terminal leads are connected at one of their ends with an edge of the wiring pattern of the upper wiring layer. The power circuit element is attached to a surface of the upper wiring layer adjacent the leads and is electrically connected with the external connection terminal leads by means of bond wires. The control circuit element is attached to a surface of the upper wiring layer and adjacent other external connection terminal leads. The control circuit element is electrically connected with the power circuit element and to the external connection terminal leads through a wiring bonding pattern to control the power circuit element(s). The EMC encloses the power circuit element(s), the control circuit element, the upper wiring layer, the metal oxide substrate, the inner ends of the external connection terminals, the internal bond wires, and exposes the outer ends of the external connection terminals.

According to still further another aspect of the present invention, there is provided a power module package, which includes: a metal/metal oxide substrate; a first wiring layer; a second wiring layer; external connection terminals; a power circuit element; a control circuit element; and an EMC. The metal/metal oxide substrate includes: an electrical insulation layer made of an oxide on a metal plate. A plurality of vias are made that comprise the metal within the electrical insulation layer. The vias pass through the insulation layer. A first wiring layer has a first wiring pattern connected with one end of the vias and is directly attached to a first surface of the metal/metal oxide substrate. The second wiring layer has a second wiring pattern connected to the other end of the vias and is directly attached to a second surface of the metal/metal oxide substrate. The external connection terminal leads are connected at their inner ends to an edge of the first wiring pattern of the first wiring layer. The power circuit element is attached to a surface of the second wiring layer and electrically connected with the via through the second wiring pattern. The control circuit element is attached to a surface of the first wiring layer between the external connection terminal leads and is electrically connected with the via and the external connection terminal leads through the first wiring pattern to control chips within the power circuit element. The EMC encloses the power circuit element, the control circuit element, the first wiring layer, the second wiring layer, the metal oxide substrate, and one end of the external connection terminals, exposing the other end of the external connection terminals.

According to one aspect of the above-described embodiment, all or part of one surface of the electrical insulation layer of the heat sink may be exposed to an outside of the EMC.

According to another aspect of the present invention, there is provided a power module package, which includes: a metal/metal oxide substrate; a case; an upper wiring layer; external connection terminal leads; a power circuit element; a control circuit element; and silicone. The metal/metal oxide substrate includes: a heat sink of a plate made of metal and an electrical insulation layer formed at least on an upper surface of the heat sink and made of an oxide of the metal. The case includes: sidewalls with bottom edges attached to an edge of the metal oxide substrate and a cap connected between the top edges of the sidewalls so as to define a predetermined space between the sidewalls. The upper wiring layer has wiring pattern and is directly attached to an upper surface of the insulation layer between the sidewalls. The external connection terminal leads are connected at their inner ends with the wiring pattern of the upper wiring layer and are exposed at their outer ends for connection to the rest a device or system. The power circuit element is attached to a surface of the upper wiring layer and electrically connected with the external connection terminal leads through the wiring pattern. The control circuit element is attached to a surface of the upper wiring layer and electrically connected with the power circuit element and the external connection terminal leads through the wiring pattern to control the power circuit element. A silicone resin fills a space of the case so as to seal up the power circuit element, the control circuit element, and the upper wiring layer.

According to another aspect of the present invention, there is provided a semiconductor package, which includes: a metal/metal oxide substrate; a wiring pattern; an external connection pad; a semiconductor chip; and an EMC. The metal/metal oxide substrate includes an insulation layer and vias made of an oxide of a plate-shaped metal and of the vias are made of the metal embedded in the insulation layer, and passing through the insulation layer. A wiring pattern is formed on the first surface of the metal oxide substrate and is connected with one of the ends of the vias. An external connection pad is formed on the second surface of the metal/metal oxide substrate and is connected with the other ends of the vias. The semiconductor chip, e.g., a power circuit chip is electrically connected with the wiring pattern through a contact bump and is mounted on the first surface of the metal oxide substrate. EMC encloses the power chip and the first surface of the metal oxide substrate but exposes the second surface of the metal oxide substrate.

According to another aspect of the present invention, there is provided a method for manufacturing a power module package, in which: a lead frame having external connection terminals in its edge is provided, a heat sink of a plate made of metal is oxidized to form an electrical insulation layer on at least on an upper surface of the metal plate; a power circuit chip and a control chip are attached to a first surface of the lead frame; the lead frame is attached to the metal oxide substrate so that the insulation layer is affixed at least on a region of a second surface of the lead frame that corresponds to a region on the first surface where the power circuit element is attached; a wire bonding operation is performed to connect one or more power circuit chips and a control circuit chip; and encapsulating using an EMC to encapsulate the power circuit element(s), the control circuit element, the lead frame, and the metal/metal oxide substrate and expose the external connection terminal leads.

According to another aspect of the present invention, there is provided a method for manufacturing a power module package, in which: a metal/metal oxide substrate including a heat sink of a plate made of metal and an insulation layer formed at least on an upper surface of the metal plate heat sink and made of an oxide of the metal are prepared for attachment to the lead frame; an upper wiring layer having a wiring pattern is attached to an upper surface of the insulation layer; inner ends of external connection terminal leads are attached to an edge of the wiring pattern of the upper wiring layer; one or more power circuit chip(s) and a control circuit chip are attached to a surface of the upper wiring layer adjacent the inner ends of the external connection terminal leads; wire bonding is performed to connect the power circuit chip(s) and the control circuit chip; encapsulating using an EMC to enclose the power circuit element(s), the control circuit element, the upper wiring layer, the metal oxide substrate, and one end of the external connection terminals and expose the other end of the external connection terminals.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. Those of ordinary skill in the art will understand that other arrangements of power circuit elements and control circuit elements described in the specification are possible and the structures of a lead frame and a heat sink herein are exemplarily and not limited to the specific arrangements or shapes as illustrated in the drawings.

Figure 4:
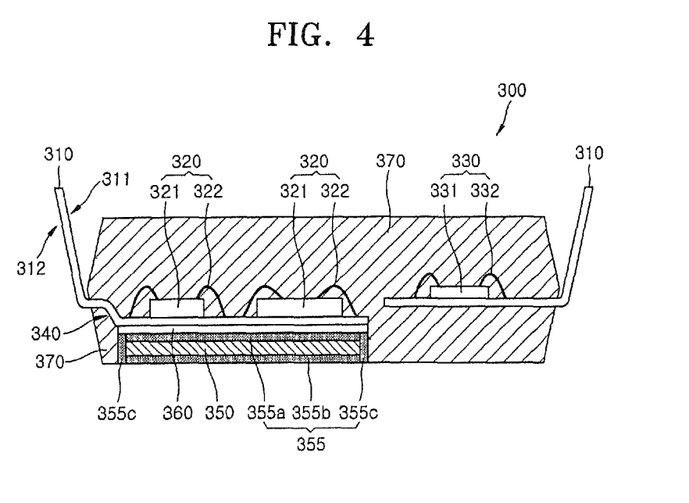
FIG. 4 is a schematic, cross-sectional view of a power module package according to a first embodiment of the present invention.

FIG. 4 is a schematic, cross-sectional view of a power module package according to a first embodiment of the present invention.

Referring to FIG. 4, a power module package 300 includes: a lead frame 310; a power circuit element 320; a control circuit element 330; a metal/metal oxide substrate 350, 355; and an EMC 370.

The power circuit element 320 includes one or more power circuit chips 321 with aluminum wire 322 to connect the chips 321 to the leads of the lead frame. The aluminum wire 322 has a diameter of about 250-500 μm to endure a high rated current. The control circuit element 330 includes a control circuit chip 331 and a gold wire 332. The aluminum wires 322 and the gold wires 332 properly connect the power circuit chip(s) 321 and the control circuit chip 331, respectively to the leads of the lead frame 310 that extend from inside the package 300 to the outside.

The lead frame 310 has a thickness of about 0.5-1 mm and has a first surface 311 on which the circuit elements are attached and a second surface 312 which is opposite to the first surface. External connection terminal leads are formed at an edge of the lead frame 310. The external connection terminal leads have inner ends adjacent to the circuit elements and outer ends that protrude through the EMC 370. A down-set die pad 340 is formed at a central portion. The circuit elements 320 and 330 may be attached to a die pad in the same plane as the leads or to a down-set die pad, such as die pad 340. The down-set die pad 340 may be positioned on a symmetric central point or may be formed at an eccentric position. The power circuit element 320 and the control circuit element 330 are attached to the first surface 311 of the lead frame. Particularly, the power circuit element 320 which generates most of the heat is attached to the first surface 311 of the down-set die pad 340 of the lead frame 310.

The metal oxide substrate 350, 355 is attached by an adhesive 360 to the second surface 312 of the lead frame 310 at a location that corresponds to the region on the first surface where the power circuit element 320 is attached. As illustrated in FIG. 4, the metal oxide substrate 350 and 355 may be attached to the second surface 312 of the down-set die pad 340 of the lead frame 310.

The adhesive 360 is an epoxy adhesive or silicone elastomer. A filler having excellent thermal conductivity and substantial electric insulation may be dispersed in the adhesive 360. For the filler, aluminum nitride (AlN), aluminum oxide ($Al_2O_3$), beryllium oxide (BeO), silicon oxide ($SiO_2$), or combination thereof may be used. For the adhesive 360, a high temperature tape or solder for a high temperature may be used, such as Pb/Sn, Sn/Ag, Pb/Sn/Ag. The adhesive 360 may be formed thin within a thickness of about 10-20 μm so that thermal conductive efficiency will not deteriorate but the thickness of the adhesive 360 is not limited to that thickness.

The metal/metal oxide substrate 350, 355 includes a heat sink 350 and an insulation layer 355 made of an oxide of the metal of the heat sink 350. The heat sink 350 effectively conducts heat generated from the power circuit element 320 to the outside of the package 300. For the heat sink 350, material having an excellent conductivity is used and aluminum having a thermal conductivity of about 100-130 W/m·K is preferred. There is no limitation in thickness of the heat sink 350 and the thickness can be modified in various ways depending on a purpose of the power module package 300. Of course, other metal and metal oxide combinations are possible, e.g. Si and $SiO_2$.

The electrical insulation layer 355 should not only electrically insulate the lead frame 310 from the heat sink but also guarantee rapid heat transmission to the heat sink 350. Therefore, the layer 355 may be made of material having an excellent thermal conductivity and showing a sufficient electrical insulating ability that it can be made as thin as possible. For that purpose, the insulation layer 355 is made of an oxide of metal of the heat sink 350 such as an aluminum oxide. The aluminum oxide insulation layer 355 has a thermal conductivity of about 20 W/m·K, which is greater than the thermal conductivity the lower EMC 2 (in FIG. 1) or the adhesive 360. Further, the aluminum oxide insulation layer 355 has an excellent electric insulation property as does ceramic material. Therefore, the insulation layer, particularly, an insulation layer 355a interposed between the lead frame 310 and the heat sink 350 can display a full electrical insulating effect even with a thickness of only about 30-50 μm. The thickness of the insulation layer 355a, however, may change depending on electric properties of the application apparatus for which the power module package 300 is used.

The electrical insulation layer 355 is formed at least on an upper surface of the heat sink 350. For example, the insulation layer 355 may be formed on only an upper surface of the heat sink 350 (refer to the reference numeral 355a), or may be formed on only an upper and a lower surfaces of the heat sink 350 (refer to the reference numerals 355a and 355b), or may be formed over an entire surface of the heat sink 350 (refer to the reference numerals 355a, 355b, 355c). The metal/metal oxide substrate 355 may be formed by anodizing metal 350 that would be used as the heat sink 350. When the electrical insulation layer 355 on a partial surface of the heat sink 350, an oxidation operation is performed with the rest surface of the heat sink 350 masked. When the insulation layer 355 is formed over the entire surface of the heat sink 350, the manufacturing operation becomes simple and the hardness of the metal oxide substrate 350 and 355 is increased and thermal property of the power module package 300 is improved. When forming the insulation layer 355a on only the upper surface or forming the insulation layers 355a and 355b on only the upper surface and the side of the heat sink 350, a heat transmission property of the power module package 300 is also improved.

The EMC 370 is intended to maintain an electrical insulation state between the elements 320 and 330 by isolating the power circuit element 320 and the control circuit element 330 from each other and by isolating both of them from the outside. The EMC 370 may be formed using an epoxy molding compound having an excellent insulating property. In that case, the EMC 370 encloses the power circuit element 320, the control circuit element 330, the lead frame 310, and metal oxide substrate 350 and 355, exposing the outer ends of external connection terminal leads of the lead frame 310. To improve a heat transmission, the EMC 370 may expose one side of the metal/metal oxide substrate 355 to the outside.

According to the above-described power module package 300 has an aluminum heat sink which has an excellent heat conductivity and the aluminum oxide which has relatively good thermal conductivity and electrically insulates the aluminum 350 from the lead frame 310.

FIGS. 10A through 10D are cross-sectional views explaining an example of a method for manufacturing a power module package 300 according to a first embodiment of the present invention.

Figure 10A:
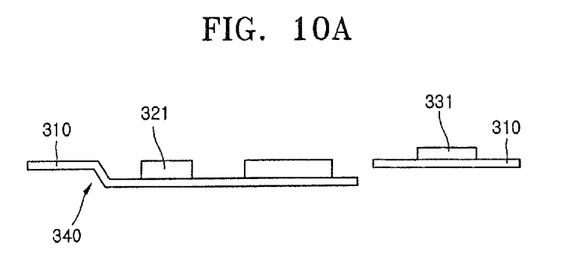
FIGS. 10A through 10D are cross-sectional views explaining a method for manufacturing a power module package according to an embodiment of the present invention.

First, referring to FIG. 10A, a lead frame 310 having a thickness of about 0.5-1.0 mm is prepared. Power circuit chip(s) 321 and a control circuit chip 331 are attached to a surface of the lead frame 310 through a die attach operation. The power circuit chip(s) 321 are attached to a down-set die pad portion 340 of the lead frame 310. The die attach operation can be performed using solder or using silver epoxy. When solder is used for an adhesive (not shown), the die attach operation is performed within a temperature range of about 350-380° C., a pressure range of about 3-5 kg/cm$^2$, and in a hydrogen atmosphere. When silver epoxy is used for an adhesive, the die attach operation is performed at room temperature and at a pressure range of 1-2 kg/cm$^2$.

Figure 10B:
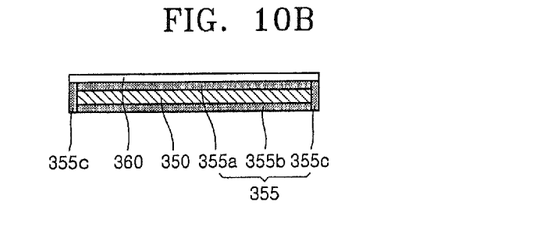

Next, referring to FIG. 10B, oxidizing one or more surfaces of an aluminum plate 350 to provide aluminum oxide layers 355a, 355b, 355c. An adhesive 360 such as an epoxy or a silicone elastomer, including a filler is attached to an upper surface of the insulation layer 355a.

Figure 10C:
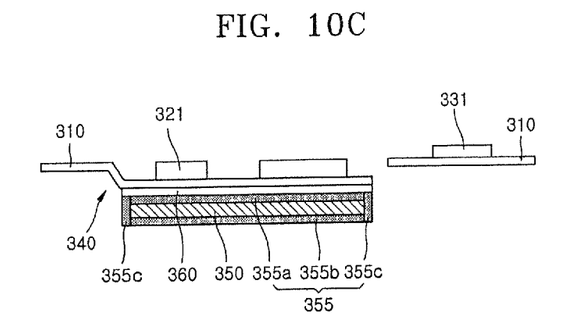

Next, referring to FIG. 10C, the aluminum/aluminum oxide substrate 355 is attached to the lower surface of lead frame 310, at a position below the location where power circuit chip(s) 321 are attached to the upper surface, using the epoxy 360 including the filler for an adhesive. The above attach operation may be performed under a temperature range of about 150-180° C. and a pressure range of 0.5-1.0 kg/cm$^2$ for about 3-5 minutes but is not limited to those specific ranges.

Figure 10D:
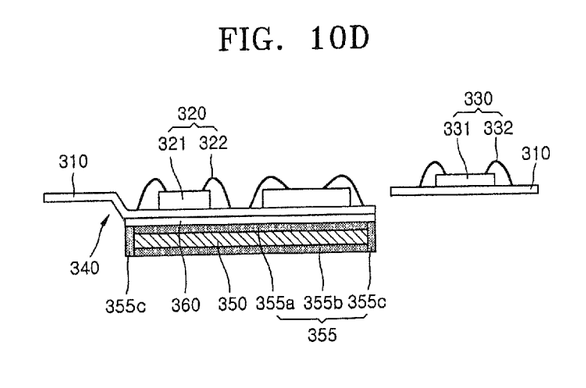

Referring to FIG. 10D, an aluminum (Al) wire bonding operation and a gold (Au) wire bonding operation are performed so that the power circuit chip 321 is electrically connected with the lead frame 310 and the power circuit chips 321 are electrically connected each other, and the control circuit chip 330 is electrically connected with the lead frame 310. Generally, a gold wire is used as a wire for the control circuit chip 330 and an aluminum wire is used as a wire for the power circuit chip 321. The aluminum wire bonding operation is performed using a wedge bonding method and the gold wire bonding operation is performed using a ball bonding method. For a swift wire bonding operation, the aluminum wire 332 is bonded first and subsequently the gold wire 332 is bonded.

Subsequently, referring to FIG. 4, an encapsulation operation such as a transfer molding method is performed to enclose the circuit elements 320 and 330 so that only a lower surface of the aluminum/aluminum oxide substrate 355 and the outer ends of the leads may be exposed. After that, general subsequent operations such as a trimming and a forming are performed.

Figure 5:
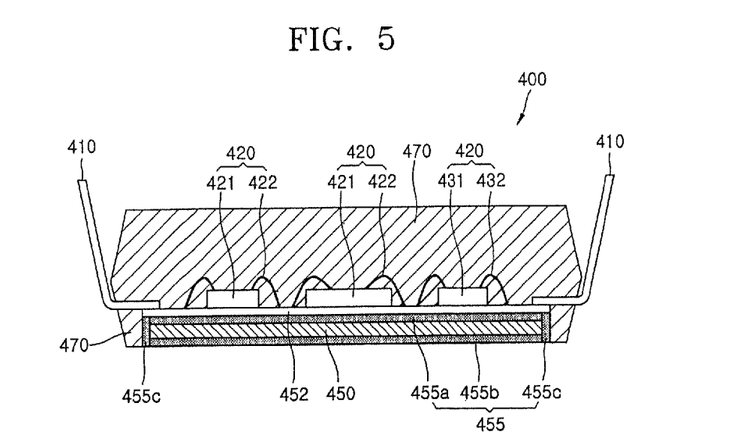
FIG. 5 is a schematic, cross-sectional view of a power module package according to a second embodiment of the present invention.

FIG. 5 is a cross-sectional view of a power module package according to a second embodiment of the present invention. The power module package 400 of the present embodiment is different from the power module package 200 of the prior art in that it uses the metal/metal oxide substrate 455 having an upper wiring layer 452 on its upper part, not the DBC substrate (refer to a reference numeral 250 in FIG. 3) including ceramic. A difference between the power module package 300 of the above-described first embodiment and that of the related art will be described in more detail.

Referring to FIG. 5, the power module package 400 according to the first embodiment includes: a lead frame 410; one or more power circuit elements 420; a control circuit element 430; an upper wiring layer 452; an aluminum/aluminum oxide substrate 455; and an EMC 470. The power circuit element(s) 420 include power circuit chips 421 and aluminum/gold wire 422. The control circuit element 430 includes a control circuit chip 431 and aluminum/gold wire 432. The aluminum/aluminum oxide substrate 450, 455 includes heat sink 450 and an insulation layer 455a formed at least on an upper surface of the heat sink 450. As illustrated in FIG. 5, the insulation layer 455a may be formed over an entire surface of the heat sink 450. See layer 455b (lower) and 455c (sidewalls).

The upper wiring layer 452 has a wiring pattern for leads (not shown) and regions between leads are filled with insulating material. The insulating material may be part of the EMC 470. The power circuit chip 421 and the control circuit chip 431 are attached to a surface of the upper wiring layer 452 and the aluminum/gold wire 422 and the aluminum/gold wire 432 are connected to the leads of the wiring pattern of the upper wiring layer 452. The upper wiring layer 452 is directly attached to a surface of the upper insulating layer 455a of the aluminum oxide layer 455. The wiring pattern of the upper wiring layer 452 connects the power circuit elements 420, connects the lead frame 410 with the power circuit element 420, and electrically connects the power circuit element with the control circuit element 430.

In the power module package 400 having the above-described structure, the heat sink 450 has excellent thermal conductivity and acts as a heat sink and the aluminum oxide 455a, 455b, 455c is an excellent thermal conductor and a relatively excellent electric insulator. Further, the upper wiring layer 452 is directly attached to a surface of the upper insulation layer 455a of the metal/metal oxide substrate 455 to that heat transmission is increased even more.

Figure 11:
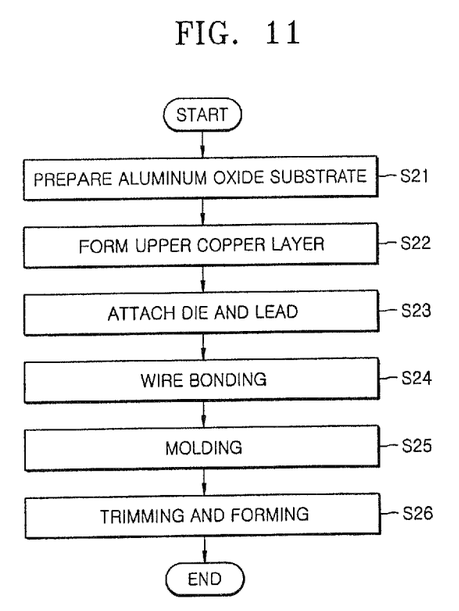
FIG. 11 is a flowchart explaining a method for manufacturing a power module package according to another embodiment of the present invention.

FIG. 11 is a flowchart explaining an example of a method for manufacturing a power module package according to a second embodiment of the present invention.

First, aluminum/aluminum oxide substrate 455 is prepared (S21). The aluminum/aluminum oxide substrate 455 includes the heat sink 450 and at least one insulation layer 455a made of the aluminum oxide and formed at least on an upper surface of the heat sink 450. The insulation layer 455a may be formed over an entire surface of the heat sink 450. The aluminum/aluminum oxide substrate 455 may be manufactured by performing a general aluminum oxidation operation known or anodizing. Such anodizing processes are well known.

The upper wiring layer 452 is directly formed on the insulation layer 455a (S22). The upper wiring layer 452 may be formed on the aluminum oxide layer 455 by a lamination method using Cu, Cu/Ni, Cu/Au, or Cu/Ni/Au, or a sputtering method using the above metal. The upper wiring layer 452 has a properly-shaped wiring pattern for electric connection.

Subsequently, the external connection terminal lead has its inner ends attached to an edge of the upper wiring layer 452 (S23). This attach operation may be performed using an adhesive such as solder or a thermal tape, laser or spot welding, or using a thermal fusion method using silver (Ag) or silver (Ag)/stannum (Sn) plating. Next, the power circuit chip 421 and the control circuit chip 431 are attached to a surface of the upper wiring layer 452. The operation for attaching those chips 421 and 431 can be performed using solder and silver epoxy. For attaching the power circuit chip 421, solder is used. In that case, the attach operation is performed within a temperature range of about 330-360° C. For attaching the control circuit chip 431, silver epoxy is used. In that case, the attach operation is performed under a room temperature.

Next, the wire bonding operation is performed (S24). For the power circuit chip 421, an aluminum wire is used, and for the control circuit chip 431, a gold wire is used. The wire bonding operation may be performed in the same way as the wire bonding operation of the above-described manufacturing operation. As a result, the chips 421 and 431 are electrically connected with the wiring pattern of the upper wiring layer 452.

After that, an encapsulation operation such as a molding operation is performed using the EMC 470 (S25). In the encapsulation operation, a transfer molding method may be used. After general trimming and forming operations are performed (S26), the power module package 400 as illustrated in FIG. 5 is completed.

Figure 6:
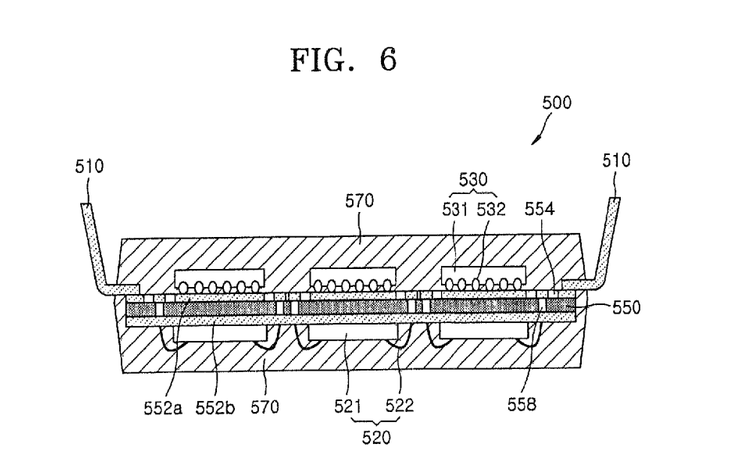
FIG. 6 is a schematic, cross-sectional view of a power module package according to a third embodiment of the present invention.

FIG. 6 is a cross-sectional view of a power module package according to a third embodiment 500 of the present invention. In the third embodiment, only differences between package 500 and the first and the second embodiments will be described in detail. Referring to FIG. 6, a power module package 500 includes metal/metal oxide substrate 550, 558, a first wiring layer 552a, a second wiring layer 552b, external connection terminals 510, a power circuit element 520, a control circuit element 530; and an EMC 570. The power module package 500 according to the third embodiment is characterized by having a metal oxide substrate 550 with vias 558 where the vias 558 pass through an insulation layer 550 to electrically connect the first wiring layer 552a with the second wiring layer 552b.

The metal/metal oxide substrate 550, 558 has an aluminum oxide substrate 550 that has a planar configuration with a plurality of conductive vias 558 in the substrate 550. The vias 558 pass through the insulation layer 550. The conductive vias 558 may be formed using metal, e.g., aluminum. The aluminum/aluminum oxide substrate 550, 558 may be manufactured by masking the via regions and oxidizing the rest of an aluminum metal plate. The unmasked portions will remain as aluminum.

The first wiring layer 552a includes a first wiring pattern (not shown) and the first wiring pattern is connected to one of the ends of vias 558. As an alternative, the first wiring pattern could be electrically connected with a control circuit chip 531 through external connection terminals of the control circuit chip 531, such as a bump 532. The control circuit element 530 including the control circuit chip 531 and the external connection terminals 532 are attached to a surface of the first wiring layer 552a.

The second wiring layer 552b includes a second wiring pattern (not shown) and the second wiring pattern is connected with the other ends of the vias 558. As an alternative, the second wiring pattern could be electrically connected with the power circuit chip 521 through an external connection terminal of the power circuit chip 521, such as an aluminum wire 522. The power circuit element 520 including the power circuit chip 521 and the external connection terminal 522 is attached to a surface of the second wiring layer 552b.

The external connection terminal 510 of the power module package 500, such as an external lead, is attached to an edge of the first wiring layer 552a that is electrically connected with the first wiring pattern. Alternatively, the external connection terminal 510 may be attached to an edge of the second wiring layer 552b to be electrically connected with the second wiring pattern.

The power module package 500 dissipates less heat than the power module packages 300 and 400 according to the above-described first and second embodiments. However, since the chips 521 and 531 are mounted on both sides of the aluminum oxide substrate 550 and 558, module 500 has a smaller size than modules 300 and 400. Further, since the oxidized aluminum insulation layer 550 has better heat conductivity than the printed circuit boards (PCB) that are often used in a power module semiconductor package, it can be appropriately used as a power module for an application apparatus of relatively low power.

Figure 7:
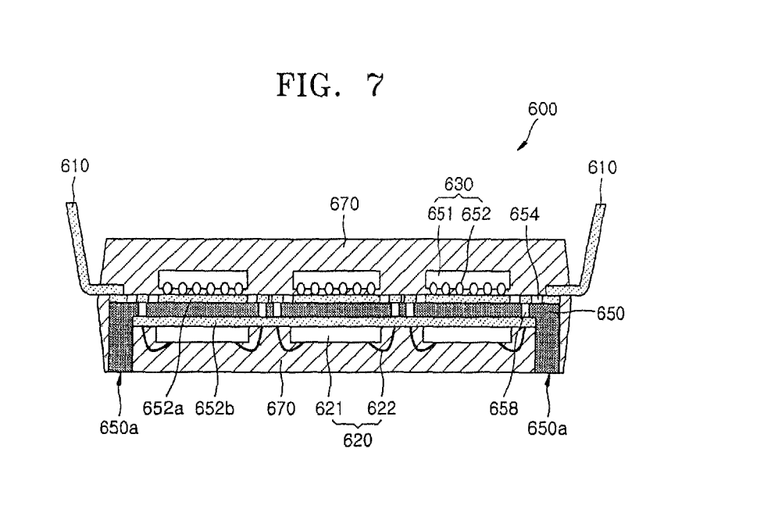
FIG. 7 is a schematic, cross-sectional view of a modification of a power module package according to a third embodiment of the present invention.

FIG. 7 is a cross-sectional view of a power module package 600 according to a fourth embodiment of the present invention. The package 600 is a modification of the third embodiment, package 500. Referring to FIG. 7, a power module package 600 includes metal/metal oxide substrate 650, 658, a first wiring layer 652a, a second wiring layer 652b, external connection terminals 610, a power circuit element 620, a control circuit element 630, and an EMC 670.

The power module package 600 according to the fourth embodiment is different from the power module package 500 of the third embodiment in that part of surface 650a of the metal oxide substrate 650 is exposed outside of the EMC 670. Although the power module package 500 according to the third embodiment with the insulation layer 550 has excellent thermal conductivity, the entire surface of the insulation layer 550 is enclosed by the EMC 570. Accordingly, when the power module package 500 according to the third embodiment is used for a long time, its heat dissipation deteriorates. On the contrary, because the power module package 600 of the fourth embodiment exposes part 650a of the surface of the insulation layer 650, its heat dissipation efficiency is better than the power module package 500 of the third embodiment.

Referring to FIG. 7, opposite ends of the insulation layer 650 are bent vertically downward so that the left and right parts 650a of the surface of the electrical insulation layer 650 may be exposed to the outside. However, the illustrated shape of the electrical insulation layer 650 is a mere example. For example, the electrical insulation layer 650 may have a bent portion forming an angle greater or smaller than 90° or may have a straight portion with no bent portion.

Figure 8:
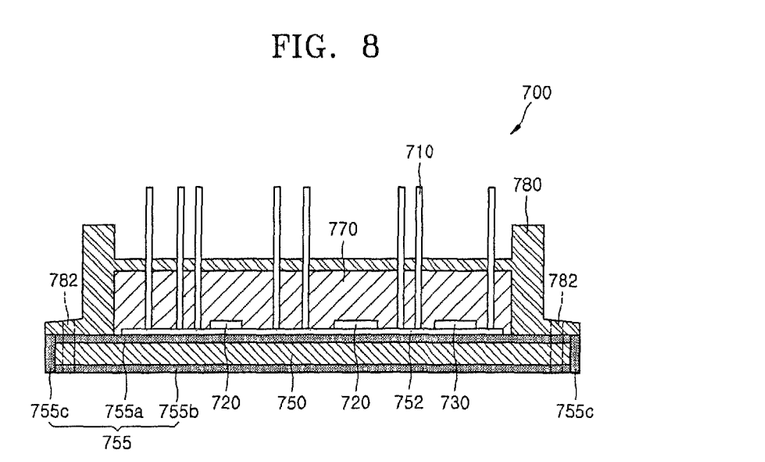
FIG. 8 is a schematic, cross-sectional view of a power module package according to a fifth embodiment of the present invention.

FIG. 8 is a cross-sectional view of a power module package 700 according to a fifth embodiment of the present invention. Referring to FIG. 8, the power module package 700 includes metal/metal oxide substrates 750, 755, a case 780, an upper wiring layer 752, external connection terminals 710, a power circuit element 720, a control circuit element 730, and a silicone resin 770. The power module package 700 according to the fifth embodiment is similar in its structure to the power module package 400 of the second embodiment except for the following differences.

Package 700 uses a silicone resin instead of an epoxy resin as an encapsulating resin 770 because the power module package 700 of the present embodiment is so large in its package area that the molding operation cannot be performed using the epoxy resin. In addition, due to the fluent property of silicone resin 770, case 780 is provided so that a frame of the silicone resin may be maintained. The case 780 can be manufactured using plastics.

The case 780 includes sidewalls 721-724 and a cap 720 and the sidewalls are attached at their bottom ends to an edge of the metal oxide substrates 750 and 755. The cap 720 is connected between the sidewalls 721-724 to define a predetermined space between the sidewalls and the predetermined space is filled with the silicone resin 770. The case 780 may be attached to a surface of the metal oxide substrates 750 and 755 using an adhesive or may be fastened to the surface of the metal/metal oxide substrates 750, 755 by inserting a fastening member such as a bolt into locking holes 782 formed on the metal oxide substrates 750 and 755 and the case 780, respectively. A plurality of external connection terminals 710 pass through the case 780 and are electrically connected to the upper wiring layer 752.

The power module package 700 may house a high power device, such as an insulated gate bipolar transistor (IGBT). The power module package 700 is useful where the power device generates high heat. Further, in the power module package 700 of the present embodiment having the aluminum/aluminum oxide substrates 750, 755 overcome the brittleness problem of the power module package having the DBC substrate including a ceramic plate.

Figure 9:
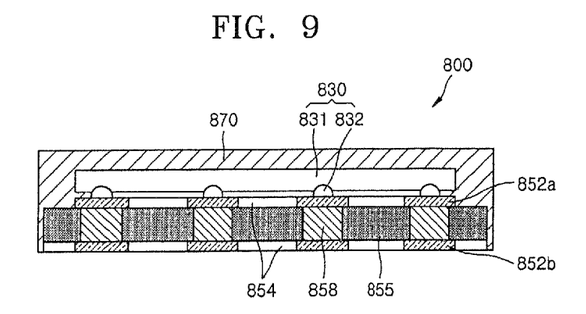
FIG. 9 is a schematic, cross-sectional view of one example of a semiconductor package according to the present invention.

FIG. 9 is a cross-sectional view of one example of a semiconductor package 800 according to a sixth embodiment of the present invention. Referring to FIG. 9, a semiconductor package 800 includes aluminum/aluminum oxide substrate 855, 858, a wiring pattern 852a, external connection pads 852b, a semiconductor element 830, and a sealing resin 870.

The semiconductor package 800 according to the sixth embodiment is similar in its structure to a flip chip semiconductor package. One difference is that aluminum/aluminum oxide substrate 855, 858 includes an electrical insulation layer 855 made of a plate of aluminum oxide and a plurality of vias 858 made of non-oxidized aluminum that pass through the insulation layer 855. The aluminum/aluminum oxide substrate 855, 858 can be formed by masking an aluminum plate and oxidizing the opposed aluminum to create the vias 858.

The wiring pattern 852a connected with one end of the vias 858 is formed on a first surface of the aluminum/aluminum oxide substrate 855, 858. A semiconductor chip 831 is mounted on the first surface and electrically connected with the wiring pattern 852a through the bump 832. A solder resist 854 may be spread between the wiring patterns 852a. The external connection pads 852b connected with the other end of the via 858 is formed on a second surface of the aluminum/aluminum oxide substrate 855, 858, which is an opposite side of the first surface. A solder resist may be also spread between the external connection pads 852b. The external connection pads 852b are attached to a mother substrate (not shown) using solder.

As described above, the semiconductor package having the aluminum/aluminum oxide substrate has a better heat transmission compared with the semiconductor package that uses a general PCB.

The power module package having the metal oxide substrate according to the present invention uses metal having an excellent thermal conductivity as a heat sink and uses an oxide of the metal as an electrical insulation layer so that the heat sink may be electrically insulated. The electrical insulation layer made of the oxide of such metal not only has a better thermal conductivity than the EMC resin but also shows a sufficient insulation effect in case of forming a thickness of the insulation layer thin. Therefore, according to the present invention, it is possible to manufacture the power module package having an excellent heat emission property.

In addition, since the metal/metal oxide substrate provided to the power module package of the present invention can be manufactured by oxidizing a metal, the package can be easily realized and manufacturing cost is reduced. It is not necessary to perform the two-stage molding operation using two sealing resins having different properties as was done in the prior art. Instead, the molding operation is performed using one sealing resin, so that the manufacturing process is less complex and may be automated.

According to the present invention, it is possible to use the aluminum/aluminum oxide substrate having various thickness depending on power capacity applied to the power module package and to modify its structure in various ways. Therefore, the power module package of the present invention can be applied to a package module having various power capacities.

Metal substrates with hard oxide metal coatings may be made by one or more processes. Aluminum is typically anodized to provide a hard, almost crystalline structure of aluminum oxide on the surface of the aluminum. The oxide is tightly formed and becomes, in effect, a barrier to entry of other materials. Anodizing involves the immersion of the part in an electrolyte solution while a current is passed through the solution and the part. As oxygen is formed on the anode (the positive terminal which is the part) it reacts with the part to form a thin layer of aluminum oxide on the surface. After anodizing the part can be soaked in dye which penetrates the still porous (relatively) layer of aluminum oxide. The final step is sealing the oxide layer by immersion in boiling water. Further details are found in *Electrochemistry Encyclopedia*, http:electrochem.cwru.edu/ed/encycl/art-a02-anodizing-.htm. Its entire disclosure is hereby incorporated by reference.

Anodizing aluminum or other metals provides a hard, thin barrier oxide layer that has many advantages. The barrier oxide layer is usually electrically insulating and has a relatively high dielectric constant compared to the metal from which it is formed. Aluminum oxide does not have the high thermal conductivity of aluminum. However, the rate of heat dissipation depends not only on the inherent conductivity of a material, but also its thickness. Since the layer of aluminum oxide needed for electrical insulation is relatively thin when compared to the aluminum heat sink, the thin aluminum oxide layer does not materially impair the overall thermal conductivity of the aluminum/aluminum oxide substrate. In a typical embodiment of the invention, the ratio of aluminum to aluminum oxide is about 10 to 1.

Hard, barrier oxide may also be created with silicon. It is also well known that silicon will oxidize to provide an oxide layer on the surface of silicon. This native oxide of silicon is one of its many advantages in forming integrated circuits. The silicon oxidation process proceeds in a diffusion-like matter so that oxygen atoms attach to silicon atoms and thus will take on the corresponding structure of the silicon substrate. If the substrate is crystalline or polycrystalline, the silicon dioxide layer will have a similar surface. Silicon dioxide is a common dielectric in semiconductor applications.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A power module package comprising:
a power circuit element having one or more power semiconductor devices;
a control circuit element electrically connected with the power circuit element, for controlling the power semiconductor devices within the power circuit element;
a lead frame having external connection terminal leads with inner ends and outer ends and having a first surface to which the power circuit element and the control circuit element are attached and having a second surface opposite the first surface;
a metal/metal oxide substrate having a heat sink of a plate of metal and an electrical insulation layer formed at least on an upper surface of the metal plate and comprising an oxide of the metal,
a thermally conductive adhesive for attaching the electrical insulation layer to part or all of a region of the second surface of said lead frame that corresponds to a region on the first surface of said lead frame where the power circuit element is attached; and
an encapsulating resin for enclosing the power circuit element, the control circuit element, the lead frame, and the metal/metal oxide substrate, and outer end of external connection terminal leads of the lead frame.

2. The power module package of claim 1, wherein the metal is aluminum or aluminum alloy.

3. The power module package of claim 1, wherein the thermally conductive adhesive comprises a filler having a high thermal conductivity and an electric insulation property.

4. The power module package of claim 3, wherein the filler is one or more of the group consisting of a nitride, an aluminum oxide, a beryllium oxide, a silicon oxide or a compound of these oxides.

5. The power module package of claim 1, wherein the lead frame further comprises a down-set die pad and the power circuit element and the insulation layer are attached to the down-set die pad.

6. The power module package of claim 1, wherein the insulation layer is formed on a front side of the heat sink.

7. The power module package of claim 1, wherein the encapsulating resin exposes a rear surface of the metal/metal oxide substrate.

8. The power module package of claim 1, wherein the metal plate has a second oxide layer formed on its other surface.

9. The power module package of claim 1 wherein the lead frame comprises an upper wiring layer.

\* \* \* \* \*